United States Patent [19]

Lawton

[11] 4,220,875
[45] Sep. 2, 1980

[54] ELECTRONIC CIRCUIT HAVING ITS IMPEDANCE CONTROLLED BY AN EXTERNAL SIGNAL

[75] Inventor: Rodney J. Lawton, Swindon, England

[73] Assignee: Natioinal Semiconductor Corporation, Santa Clara, Calif.

[21] Appl. No.: 774,003

[22] Filed: Jul. 22, 1977

[30] Foreign Application Priority Data

Mar. 4, 1976 [GB] United Kingdom ............... 08644/76

[51] Int. Cl.$^2$ ............................................. H03K 1/14
[52] U.S. Cl. ................................... 307/264; 307/230; 307/237; 333/14; 333/81 R; 333/217
[58] Field of Search ............... 307/229, 230, 237, 264; 333/213–217, 14, 81 R

[56] References Cited

U.S. PATENT DOCUMENTS

| 3,539,826 | 11/1970 | Crouse | 333/213 X |
| 4,039,981 | 8/1977 | Ohashi et al. | 307/264 X |

Primary Examiner—John Zazworsky
Attorney, Agent, or Firm—Brown & Martin

[57] ABSTRACT

This disclosure relates to an electronic circuit which has a controllable impedance. This type of circuit is well suited for application in noise suppression circuits or in signal compression/expansion circuits. The circuit has two stages. The first stage is a voltage to current converter. The second stage is a variable gain current amplifier. The output of the second stage is connected by a feedback loop to an input of the first stage. The circuit has a variable impedance which can be controlled by an external signal. The imput impedance of the circuit is linearly related to the applied control signal.

11 Claims, 3 Drawing Figures

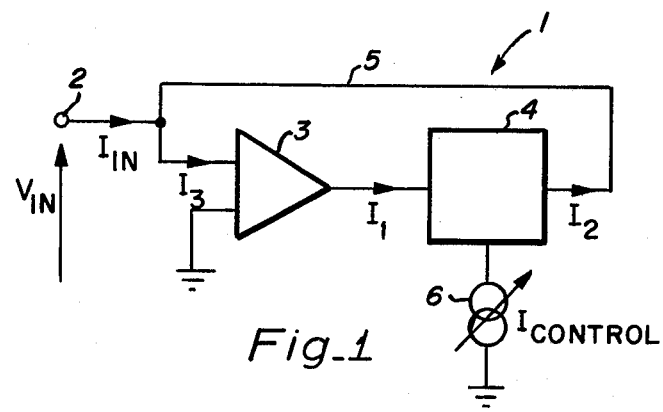
Fig_1
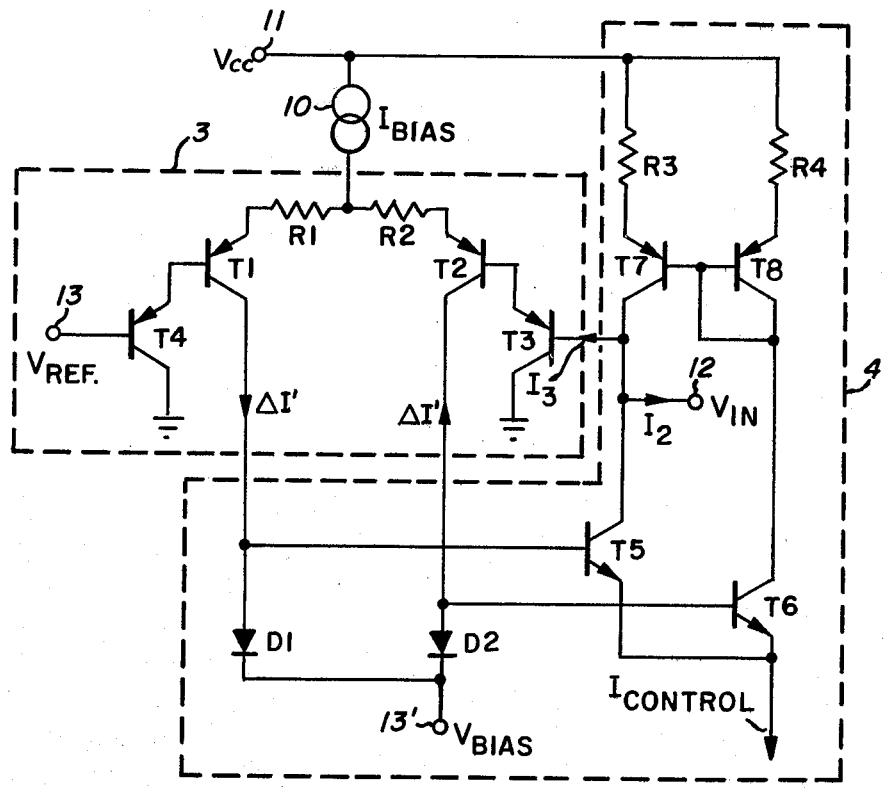
Fig_2

ELECTRONIC CIRCUIT HAVING ITS IMPEDANCE CONTROLLED BY AN EXTERNAL SIGNAL

BACKGROUND OF THE INVENTION

1. Field of the Invention

This invention relates generally to electronic circuits having a controllable impedance, and more particularly, to an electronic circuit having a controllable impedance which can be used in noise suppression circuits or in signal compression/expansion circuits.

2. Description of the Prior Art

In the past, a number of circuits have been developed for compression and/or expansion of the magnitude or amplitude of electrical signals. However, a number of these prior art circuits required the use of capacitors, inductors or other bulky or relatively large components. As a consequence, these prior art circuits could not be readily fabricated in integrated circuit form, but were generally made using discrete components. Additionally, a number of these prior art circuits required the use of high supply voltages for circuit operation. Furthermore, many prior art circuits were basically Input-/Output type circuits which were generally much more complex. A number of the prior art circuits also used log or square law type controls to vary the amplification or magnitude of the signal and these circuits therefor were generally complex. Another disadvantage associated with many of these prior art circuits was that they single-ended and therefor unbalanced thereby making these circuits susceptible to distortion and/or hum problems.

Accordingly, a need existed to provide an electronic circuit having its impedance controlled by an external signal which would eliminate the above identified problems associated with prior art circuits seeking to control the amplitude or magnitude of generated signals.

SUMMARY OF THE INVENTION

Accordingly, it is an object of this invention to provide an improved circuit having its impedance controlled by an external signal.

It is another object of this invention to provide a circuit whose impedance is controlled by an external signal which circuit can be implemented in a single integrated circuit structure.

It is a further object of this invention to provide an integrated circuit whose impedance can be controlled by an external signal where the circuit has an input impedance which is linearly related to the control current.

It is still another object of this invention to provide an improved circuit whose impedance can be readily varied over a wide range.

It is a still further object of this invention to provide a balanced, integrated differential amplifier circuit with a wide range of impedance control.

The foregoing, and other objects, features, and advantages of the invention will be apparent from the following, more particular description of the preferred embodiment of the invention, as illustrated in the accompanying drawing.

BRIEF DESCRIPTION OF THE DRAWING

FIG. 1 is a block diagram of an electronic circuit whose impedance is controlled by an external signal in accordance with this invention;

FIG. 2 is a detailed circuit diagram of the block diagram shown in FIG. 1; and

THE SPECIFICATION

Figure 3:
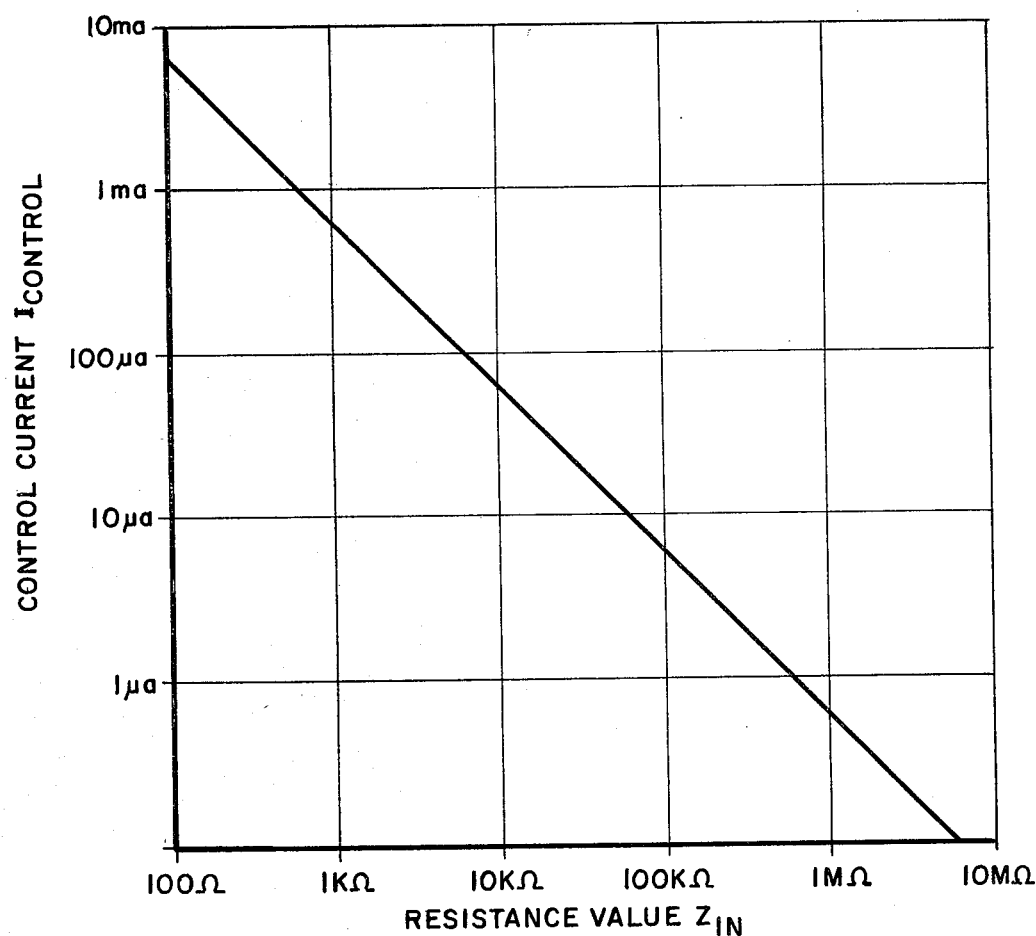
FIG. 3 is a graph illustrating the impedance range which can be obtained with the circuit shown in FIG. 2.

Referring to the block diagram of FIG. 1, a circuit having a variable electronic impedance is generally designated by reference number 1. This circuit 1 has an input terminal 2 connected to an input of a first stage 3 which is a high input impedance voltage-to-current converter circuit generally known as an operational amplifier. The first stage 3 has its output connected to a second stage 4 which is a variable gain current amplifier. The second stage 4 has its output connected via a feedback loop 5 to the terminal 2 and thus to the input of stage 3. A variable "constant-current" source 6 is included in the second stage, but is shown separately to illustrate that presetting or variable control of the second stage 4 can be achieved by means of a variable electrical signal (a current signal in the case of the source 6 although a voltage signal could be used).

A typical function of the circuit 1 is to attenuate a voltage signal ($V_{in}$) applied to the input between terminal 2 and ground. The first stage 3 detects the voltage signal and converts it into a current output signal ($I_1$) which is amplified by the second stage 4 to produce an output current $I_2$. Since the first stage 3 has high input impedance, the current ($I_3$) applied to the first stage 3 can be made negligibly small in comparison with the current output $I_2$ by suitable presetting of the second stage 4 by means of the source 6. It can then be assumed that $I_2 = I_{in}$ where $I_{in}$ is the effective current from the terminal 2 through the circuit 1 due to $V_{in}$. Thus the effective impedance $Z_{in}$ of the circuit 1 is given by $$Z_{in} = (V_{in}/I_{in}) = (V_{in}/I_2)$$

Now the second stage 4 is configured so that $I_2/I_1 = \pm K I_{control}$
where K is a constant and $I_{control}$ is the "constant current" obtained by means of source 6.

Also $I_1 = \pm G_m V_{in}$ where $G_m$ is a constant characteristic of the conversion operation of the first stage 3. Thus $$\begin{aligned} I_2 &= \pm K I_{control} I_1 \\ &= \pm K I_{control} G_m V_{in} \end{aligned}$$

And so $$\begin{aligned} Z_{in} &= \pm \frac{1}{K I_{control} G_m} \\ &= \pm (1/K G_m)(1/I_{control}) \\ &= \pm \text{constant} (1/I_{control}) \end{aligned}$$

The circuit 1 can provide positive or negative impedance by suitable phasing of the stages 3 and 4, care being taken to achieve the desired input impedance. Hence, the circuit 1 can be used to attenuate (or amplify within limits of stability) a voltage appearing at $V_{in}$. The important result is that it is possible to determine Z in circuit 1 solely by selection of $I_{control}$ and the latter can be varied readily in a controlled manner to provide a circuit 1 having an impedance which is variable in a well defined manner.

It should be noted that as $I_{control}$ approaches zero, $I_2$ also approaches zero and $I_3$ becomes important. When the value of $I_{control}$ approaches zero, the maximum value of $Z_{in}$ approaches $V_{in}/I_3$.

Referring also to FIG. 2, one form of the variable electronic impedance circuit 1 of FIG. 1 is shown in schematic form. The stages 3 and 4 of FIG. 1 are shown within dashed boxes in FIG. 2.

The first stage 3 comprises a differential amplifier in the form of an emitter-coupled pair of PNP transistors T1, T2 whose emitters are connected via respective, identical resistors R1, R2 through a common connection to a constant bias-current source 10 connected to the supply and bias voltage $V_{CC}$ at terminal 11. Each of the transistors T1, T2 has a Darlington-connected input PNP transistor T4, T3, respectively. Transistor T3 has its base connected to the circuit input terminal 12 and transistor T4 has its base connected to a reference voltage ($V_{ref}$) applied to terminal 13. In some applications, the transistors T3, T4 can be omitted, if desired, since they are provided to ensure that $$\Delta \frac{(V_{ref} - V_{in})}{I_3} \longrightarrow \infty$$

where the prefix "$\Delta$" indicates changes in the above parenthetical expression.

The collectors of the transistors T1, T2 provide the output of the first stage 3. The changes in current from the collectors of T1, T2 are detected by respective matched, forward-biased diodes D1, D2 operating over the exponential range of their current-voltage characteristics. Diodes D1, D2 are located in stage 4. The diodes D1, D2 have their cathodes connected to a common reference voltage ($V_{bias}$) at terminal 13'. The anodes of the diodes D1, D2 are connected to respective bases of emitter-coupled, matched NPN transistors T5, T6. The common emitter connection of NPN transistors T5, T6 is connected to ground through a variable "constant current" source (not shown) such as $I_{control}$ source 6 (see FIG. 1). The collectors of NPN transistors T5, T6 are connected to the supply voltage ($V_{cc}$) applied to terminal 11 via the respective PNP transistors, T7, T8 and identical resistors R3, R4. The transistors T7, T8 are matched and the bases of transistors T7 and T8 are electrically connected to the collector of transistor T8. Terminal 12 (terminal 12 is the same as terminal 2 of FIG. 1) is also connected to the collector of transistor T7.

OPERATION

In operation, $I_{bias}$ source 10 is chosen so that the diodes D1, D2 operate in the exponential portion of their current-voltage characteristics. If $I_{bias}$ (source 10) is chosen sufficiently precisely, the maximum permissible current change $\Delta I'_{max}$ in the current $I'$ through each diode is given by $$\Delta I'_{max} \approx I_{bias}/2$$

if the diodes D1, D2 are to operate exponentially as mentioned above. The signal handling capability of the first stage 3 is limited by the need to keep the diodes D1, D2 operating exponentially. Signal handling capability S is given by $S = 2(V_{ref} - V_{in})_{max}$ and since $2\Delta I' R \alpha (V_{ref} - V_{in})$ defines the voltage-to-current conversion operation of the first stage 3 (apart from a constant depending on the components used), then $$S = 2(V_{ref} - V_{in})_{max} \alpha 2R \Delta I'_{max} = R I_{bias}$$

"R" is the value of the fixed resistance (R1, R2). Thus we have that the signal handling capability of the first stage 3 is proportional to a fixed resistance (R1, R2) and a bias current ($I_{bias}$) which can be readily selected on the basis of the known characteristics of the diodes D1, D2.

NPN transistors T5, T6 are also arranged to operate in the exponential range of their collector current-base voltage characteristics. This is achieved by appropriate determination of the collector (or emitter) current of the transistors T5, T6. $I_{control}$ must not be greater than the sum of the maximum permissible collector currents through the transistors T5, T6.

Thus, with matching of the operating voltage range of the diodes D1, D2 to the operating base voltage range of the transistors T5, T6, a linear response to changes $\Delta I'$ can be obtained in terms of changes in the collector currents of transistors T5, T6. The PNP transistors T7, T8 are arranged to insure that when $V_{in} = -V_{ref}$ the emitter-collector current through the transistor T7 substantially equals the emitter-collector current through the transistor T5 (assuming that input current $I_3$ (see FIGS. 1 and 2) can be neglected as mentioned earlier). In other words, the PNP transistors T7, T8 are arranged to minimize the "offset" voltage (the extent by which the graph of $Z_{in}$ versus $I_{control}$ (see FIG. 3) fails to pass through the origin).

When a signal ($V_{ref} - V_{in}$) is received at the terminal 12, the first stage 3 provides two current signals $+\Delta I'$ and $-\Delta I'$ (shown by the reversed arrows) to diodes D1 and D2, the relative phases of the current signals depending on the phase or polarity of $V_{in}$. The diodes D1, D2 supply the current signals $+\Delta I'$, $-\Delta I'$ creating substantially equal and opposite voltages to the bases of transistors T5, T6 giving rise to substantially equal and opposite collector current changes through the transistors T5, T6. As mentioned above, these collector current changes are substantially linearly related to the current changes $+\frac{1}{2}I'$ and $-\alpha I'$. Since the current flowing through the bases of transistors T7, T8 is very small, the linear collector current change of the transistor T6 is equal to the collector current change of the transistor T8 which must therefore be linear. Due to the balanced arrangement, the collector current change of the transistor T7 must be the same as that of the transistor T8. Thus, at the terminal 12, a linear change in the collector current of the transistor T5 must be summed algebraically together with a linear change in the collector current of the transistor T7. the result of this is the current $I_2 = I_{in}$ (assuming $I_3$ is sufficiently small enough to be neglected). Hence, variation in $V_{in}$ gives rise to variation in $I_{in}$ that is linearly related to $V_{in}$. This linearity can be expressed in terms of the impedance $Z_{in}$ of the circuit 1 (see FIG. 3).

When $V_{in} = V_{ref}$ the differential current gain of the second stage 4 is given by:-

$$\Delta I_2/2 \Delta I' = I_{control}/I_{bias}.$$

From the above, it can be seen that changes in $I_2$ are linearly related to changes in $I'$ so that the differential current gain of the second stage 4 is constant and equal to $I_{control}/I_{bias}$.

As mentioned above the voltage-to-current conversion operation of the first stage 3 is given by $$2\Delta I' R \alpha (V_{ref} - V_{in}).$$

Thus we have the impedance $Z_{in}$ of the circuit 1 is given by:-

$$Z_{in} = \frac{(V_{ref} - V_{in})}{\Delta I_2} = \frac{(V_{ref} - V_{in})}{2\Delta I'} \cdot (I_{bias}/I_{control})$$

Hence $Z_{in} \alpha 2\Delta I' R / 2\alpha I'(I_{control}/I_{bias})$, i.e., $Z_{in} \alpha (RI_{bias}/I_{control})$.

Hence, the impedance characteristic $Z_{in}$ of this circuit 1 provides many advantages particularly over other electronic impedances which are intrinsically temperature dependent, e.g., intrinsically temperature dependent on kT/q where k is Boltzmann's constant, T is temperature and q is the electronic charge.

Also the impedance $Z_{in}$ of this circuit can be readily varied (by varying $I_{control}$) over a wide range (see the graph of FIG. 3) and the signal handling capability is independent of $I_{control}$. The signal handling capability S is determined solely by the first stage 3 in accordance with the relationship $S \alpha RI_{bias}$.

A particular advantage results from the balance of the circuit 1 since temperature and other disturbing effects tend to cancel out (i.e., inherently low offsets). Such balance can be optimized by using integrated circuit techniques to manufacture the circuit 1. Also the supply voltages required (such as $V_{cc}$) can be kept low ($V_{cc}$ can be kept as low as 1.2 volts) in comparison with circuits employing a series of diode junctions.

The two terminal variable electronic impedance circuit described above has particular application in noise suppression and signal compression circuits (which may be integrated circuits including this variable impedance circuit) although there are many other applications for this variable impedance circuit.

The results derived above are dependent on $I_3$ and upon the base currents of the transistors T7 and T8 being sufficiently small in comparison with the gain of the stages 3 and 4. The circuit 1 shown in FIG. 2 can be improved further by supplying the base currents of transistors T7, T8 with a buffer amplifier (e.g., another single transistor stage) as has been done in the case of $I_3$ by providing transistors T3, T4.

The circuit 1 shown in FIG. 2 may have its linearity enhanced by arranging for "bleeding" of current from the anodes of diodes D1, D2 such that the operating range of the diodes D1, D2 is matched better with that of the transistors T5, T6.

However, the currents "bled" from each anode of the diodes D1, D2 must be identical since otherwise an offset will be introduced.

BRIEF SUMMARY OF THE SPECIFICATION

Thus, the circuit 1 provides a variable electronic impedance which includes a first stage connected to an input of the circuit and having a high input impedance and a second stage connected via a feedback loop to the circuit input. The first stage is arranged to control the second stage in dependence on a voltage signal received at the circuit input. The second stage providing a current in the feedback loop in accordance with the voltage signal received by the first stage so that the second stage presents a predetermined impedance to the circuit input via the feedback loop. The gain of the second stage can be varied by means of an applied electrical signal to enable variation of the predetermined impedance.

The first stage of the circuit employs a differential amplifier having one input connected to a reference voltage source and another input connected to the input of the circuit. The differential amplifier has an emitter coupled pair of identical transistors and resistors which are connected in series with the respective emitters of the transistor pair. The collectors of the transistor pair are connected to the second stage by connection through respective matched forward-biassed diodes to a first common bias voltage point. Anodes of the diodes are connected to respective base electrodes of two emitter-coupled matched transistors of the second stage whose combined emitter current is arranged to be variably controllable and one of whose collectors is connected to the device input.

Thus, this circuit can be used as a noise suppression circuit, a signal compression circuit and a signal expansion circuit which may each be formed as an integrated circuit. Each circuit displays a variable positive or negative impedance.

While the invention has been particularly shown and described in reference to the preferred embodiment thereof, it will be understood by those skilled in the art that changes in the form and details may be made therein without departing from the spirit and scope of the invention. For example, the circuit 1, shown in FIG. 2 is only one example of the general circuit shown in FIG. 1. Additionally, in a particular application, the constant current source 6 of FIGS. 1 and 2 may be fixed so that $I_{control}$ is constant. In such a case the impedance of circuit 1 would have a fixed value.

What is claimed is:

1. A device having a controllable impedance, comprising
    an input terminal for the device;
    a high impedance first stage having an output and an input, wherein the input of the first stage is connected to the input terminal for the device, and the first stage is adapted for providing an output signal at its output in response to an input voltage signal received at its input;
    a variable impedance second stage having an output and an input, wherein the input of the second stage is coupled to the output of the first stage, and the second stage is adapted for providing a current signal at its output in response to the output signal provided at the output of the first stage;
    a feedback loop connecting the output of the second stage to the input of the first stage, whereby the device has an input impedance at its input terminal that is proportional to the impedance of the second stage; and
    control means coupled to the second stage for controlling the impedance of the second stage in response to an external signal.

2. A device according to claim 1, wherein the first stage comprises a voltage-to-current converter and the second stage comprises a variable gain current amplifier.

3. A device according to claim 2, wherein the control means comprises means for varying the gain of the current amplifier.

4. A device according to claim 3, further comprising external means connected to the control means for providing said external signal to vary the gain of the current amplifier to thereby vary the impedance of the second stage.

5. A device according to claim 1, further comprising external means connected to the control means for providing said external signal to vary the impedance of the second stage.

6. A device according to claims 4 or 5, wherein the external means comprises a variable constant-current source.

7. A device according to claim 1, wherein the first stage comprises a reference voltage terminal and a differential amplifier having first and second input terminals and an output terminal, wherein the first input of the differential amplifier is connected to the input terminal for the device and the second input terminal of the differential amplifier is connected to the reference voltage terminal, and the differential amplifier is adapted to provide said first stage output signal at its output terminal that is dependent on the difference between said input voltage signal and a reference voltage provided at the reference voltage terminal.

8. A device according to claim 7, wherein the differential amplifier includes a bias current source, two identical resistors connected in common to said bias current source, and a first emitter-coupled pair of matched transistors whose emitters are respectively connected in series with said identical resistors, whose bases are respectively coupled to the first and second input terminals of the first stage; and whose collectors constitute output terminals of the first stage; and wherein the second stage includes a pair of matched forward-biased diodes respectively connected to the collectors of the first emitter-coupled pair of matched transistors in the differential amplifier, and a first bias voltage terminal to which the diodes are connected in common, and the control means which includes a second emitter-coupled pair of matched transistors to whose base electrodes are connected respective anodes of the diodes, and whose emitters are connected so that their combined emitter current is variably controllable in response to said external signal.

9. A device according to claim 8, wherein the second stage further comprises means for minimizing offset of the device, said offset minimizing means comprising a third pair of matched transistors whose emitter-collector circuits are connected between the respective collectors of the second emitter-coupled pair and a second bias voltage terminal, wherein the transistors of the third pair have a common base connection to one of the collectors of the third pair whose other collector is connected to the differential amplifier input terminal via the feedback loop.

10. A device according to claim 9, wherein the bias current source, the diodes and the second pair of transistors are adapted for causing the diodes to operate in the exponential range of their current-voltage characteristics and for causing the second pair of transistors to operate in the exponential range of their collector current-base voltage characteristics to match the operating voltage range of the diodes to the operating base voltage range of the second pair of transistors to provide a linear response in variations of the input impedance of the device to changes in the current of said external signal.

11. A device according to claims 8, 9 or 10 further comprising a variable constant-current source connected to the emitters of the second pair of transistors for providing said external signal for controlling the impedance of the second stage.

* * * * *